(12) United States Patent
Liu

(10) Patent No.: US 11,330,723 B2
(45) Date of Patent: May 10, 2022

(54) ELECTRONIC APPARATUS

(71) Applicant: Lenovo (Beijing) Co., Ltd., Beijing (CN)

(72) Inventor: Jia Liu, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 17/002,709

(22) Filed: Aug. 25, 2020

(65) Prior Publication Data

US 2021/0068275 A1    Mar. 4, 2021

(30) Foreign Application Priority Data

Aug. 26, 2019    (CN) .......................... 201910792825.4

(51) Int. Cl.
| | | |
|---|---|---|
| *H05K 7/02* | (2006.01) | |
| *H05K 7/04* | (2006.01) | |
| *H05K 5/00* | (2006.01) | |
| *H05K 5/02* | (2006.01) | |

(52) U.S. Cl.
CPC ......... *H05K 5/0017* (2013.01); *H05K 5/0217* (2013.01)

(58) Field of Classification Search
USPC ....................................................... 361/807
See application file for complete search history.

(56) References Cited

U.S. PATENT DOCUMENTS

| | | | | |
|---|---|---|---|---|
| 6,477,039 | B2 * | 11/2002 | Tajima ...................... | H04N 5/64 248/611 |
| 7,423,878 | B2 * | 9/2008 | Kim ..................... | H05K 7/20963 361/704 |
| 8,303,157 | B2 * | 11/2012 | Yang ................. | G02F 1/133615 362/633 |
| 8,439,551 | B2 * | 5/2013 | Cho .................. | G02F 1/133308 362/634 |
| 2007/0211191 | A1 * | 9/2007 | Cho ...................... | G02B 6/0073 349/58 |

(Continued)

FOREIGN PATENT DOCUMENTS

| | | |
|---|---|---|
| CN | 104599593 A | 5/2015 |
| CN | 106910422 A | 6/2017 |

(Continued)

*Primary Examiner* — Hung S. Bui
(74) *Attorney, Agent, or Firm* — Anova Law Group, PLLC

(57) ABSTRACT

An electronic device includes a housing, a display assembly, a drive component, a support member, and a protection member. The housing includes an accommodation chamber and an opening. The opening is connected with the accommodation chamber. The accommodation chamber includes a first space and a second space. The first space overlaps with the opening along a first direction. The second space and the opening are staggered along the first direction. The display assembly is located in the first space of the accommodation chamber and exposed through the opening. The drive component is partially located in the second space of the accommodation chamber, electrically connected to the display assembly, and configured to drive the display assembly. The support member is fixed in the accommodation chamber. The protection member at the opening is fixedly connected to the display assembly, and connected to a portion of the support member.

10 Claims, 3 Drawing Sheets

(56) References Cited

U.S. PATENT DOCUMENTS

2016/0274297 A1* 9/2016 Ikuta .................... G02B 6/0091

FOREIGN PATENT DOCUMENTS

| CN | 109309742 A | 2/2019 |
| CN | 109426019 A | 3/2019 |
| JP | H04163525 A | 6/1992 |
| JP | H08292421 A | 11/1996 |
| JP | 2010128001 A | 6/2010 |

* cited by examiner

ELECTRONIC APPARATUS

CROSS-REFERENCE TO RELATED APPLICATION

This application claims priority to Chinese Patent Application No. 201910792825.4, filed on Aug. 26, 2019, the entire content of which is incorporated herein by reference.

TECHNICAL FIELD

The present disclosure relates to an electronic device.

BACKGROUND

An electronic device generally includes a display assembly and a drive. However, the drive needs to occupy certain display space, which forms a bezel area. Therefore, the display frame or bezel may be difficult to miniaturize, and thus a narrow bezel may be difficult to implement for certain electronic devices.

SUMMARY

Embodiments of the present disclosure provide an electronic device, including a housing, a display assembly, a drive component, a support member, and a protection member. The housing includes an accommodation chamber and an opening. The opening is connected with the accommodation chamber. The accommodation chamber includes a first space and a second space. The first space overlaps with the opening along a first direction. The second space and the opening are staggered along the first direction. The display assembly is located in the first space of the accommodation chamber and exposed through the opening. The drive component is partially located in the second space of the accommodation chamber, electrically connected to the display assembly, and configured to drive the display assembly. The support member is fixed in the accommodation chamber. The protection member at the opening is fixedly connected to the display assembly, and connected to a portion of the support member. The protection member is able to transit light. The first portion of the support member and a connection area of the protection member form a first bezel area.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

REFERENCE NUMERALS

Figure 1:
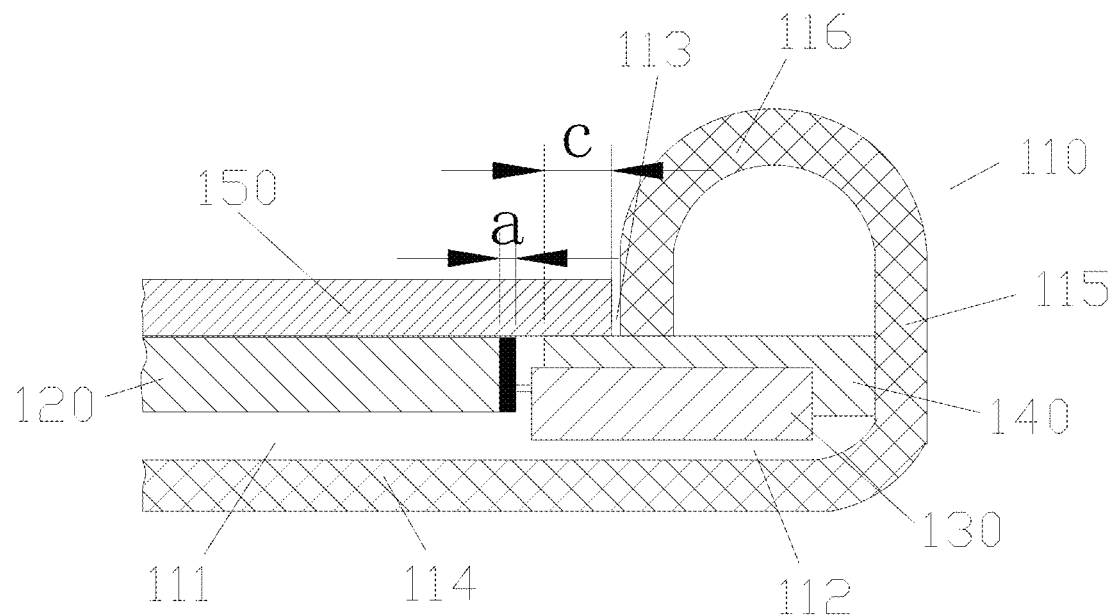
FIG. 1 illustrates a schematic partial structural diagram of an electronic device according to some embodiments of the present disclosure.

110 - housing
111 - first space
112 - second space
113 - opening
114 - bottom wall
115 - sidewall
116 - top wall
120 - display assembly
130 - drive component
140 - support member
150 - protection member

DETAILED DESCRIPTION OF SOME EMBODIMENTS

The present disclosure is further described in detail in connection with accompanying drawings and specific embodiments. Specific embodiments are merely used to explain the present disclosure but not used to limit the present disclosure.

In embodiments of the present disclosure, unless otherwise specified, the term "connection" used in the present disclosure should be understood in a board sense. For example, a connection may include an electrical connection, a connection inside two components, a direct connection, or an indirect connection through an intermediate medium. For those of ordinary skill in the art, the specific meaning of the above-mentioned terms may be understood according to specific circumstances.

In embodiments of the present disclosure, the term "first/second/third" is merely used to distinguish similar objects and does not represent a specific order of objects. The objects described by the term "first/second/third" may exchange the specific order or sequence under an allowable situation. The objects distinguished by "first\second\third" may be interchanged in an appropriate situation, such that embodiments of the present disclosure may be implemented in a sequence other than those illustrated or described in the accompanying drawings.

An electronic device of embodiments of the present disclosure is described in detail in connection with FIGS. 1-5.

The electronic device of embodiments of the present disclosure includes a housing 110, a display assembly 120, a drive component 130, a support member 140, and a protection member 150. The housing 110 includes an accommodation chamber and an opening 113. The opening 113 is connected with the accommodation chamber. The accommodation chamber includes a first space 111 and a second space 112. The first space 111 overlaps with the opening 113 along a first direction. The second space 112 and the opening 113 are staggered along the first direction. The display assembly 120 is placed in the first space 111 of the accommodation chamber. The display assembly 120 is exposed through the opening 113. At least a part of the drive component 130 is located in the second space 112 of the accommodation chamber. The drive component 130 is electrically connected to the display assembly 120. The drive component 130 is configured to drive the display assembly 120. The support member 140 is fixed in the accommodation chamber. The protection member 150 is placed at the opening 113 to cover a portion of the display assembly 120 and a portion of the support member 140. The protection member 150 is fixedly connected to the display assembly 120. The protection member 150 is connected to a first portion of the support member 140. The protection member 150 has a light transmission property. The first portion of the support member 140 and a connection area of the protection member 150 form a first bezel area.

In embodiments of the present disclosure, the structure of the electronic device is not limited. For example, the electronic device may include a laptop computer, a cell phone, or a game console.

In embodiments of the present disclosure, a structure of the housing 110 are not limited. For example, the housing 110 may include a housing 110 where a display assembly 120 of the laptop computer is located. In another example, the housing 110 may also include a housing 110 where a display assembly 120 of the cell phone is located.

In embodiments of the present disclosure, a structure of the accommodation chamber and a structure of the opening 113 are not limited, so long as the opening 113 is connected with the accommodation chamber.

In some embodiments, the accommodation chamber may include the first space 111 and the second space 112.

The first space 111 may overlap with the opening 113 along the first direction, that is, the first space may be a space corresponding to the accommodation chamber and the opening 113. The first direction may include a direction from a bottom wall of the accommodation chamber to the opening 113, that is, a thickness direction of the housing 110. The first space 111 may be an exposed space, that is, the first space 111 may be a space that may be exposed through the opening 113.

The second space 112 and the opening 113 may be staggered along the first direction, that is, the second space 112 may be a space, where the accommodation chamber is staggered with the opening 113 along the first direction. The second space 112 may be a hidden space, that is, the second space 112 may include a space that may not be exposed through the opening 113.

The first space 111 and the second space 112 may be different spaces of the accommodation chamber. The first space 111 and the second space 112 may be next to each other.

Positions of the first space 111 and the second space 112 are not limited. For example, the first space 111 may be in the middle of the housing 110. The second space 112 may be hidden at a first edge portion of the housing 110. A position of the first edge portion are not limited. For example, the electronic device may further include a body. The first edge portion may be adjacent to the body. The housing 110 here may be the housing 110 where the display screen of the laptop computer is located. The body may be a body where the keyboard of the laptop computer is located.

In embodiments of the present disclosure, a structure of the display assembly 120 are not limited, so long as the display assembly 120 is located in the first space 111 of the accommodation chamber, and the display assembly 120 may be exposed through the opening 113. For example, the display assembly 120 may include a display screen or a touch screen.

In some embodiments, the display assembly 120 may be in the first space 111, and exposed through the opening 113 to cause most of area of the opening 113 to form a display area of the display assembly 120.

In embodiments of the present disclosure, a structure of the drive component 130 are not limited, as long as the drive component 130 is electrically connected to the display assembly 120, and the drive component 130 is configured to drive the display status of the display assembly 120. For example, the display assembly 120 may include the display screen, the drive component 130 may include a printed circuit board (PCB), and the PCB may be configured to drive a display brightness or a display color of the display screen.

In embodiments of the present disclosure, an implementation for realizing the electrical connection between the drive component 130 and the display assembly 120 are not limited. For example, the drive component 130 and the display assembly 120 may be electrically connected through a flexible electrical board.

The larger a volume that the drive component 130 takes from the first space 111 is, the smaller a volume of the display space of the display assembly 120 would be.

In some embodiments, at least a part of the drive component 130 may be located in the second space 112 of the accommodation chamber. Thus, the space that the drive component 130 takes from the first space 111 may be reduced. That is, the volume that the drive component 130 takes from the display space may be reduced. As such, the area of the display bezel area of the electronic device may be reduced to cause the bezel of the electronic device to be narrower. For example, the drive component 130 may be placed in the second space 112 as a whole or may be partially placed in the second space 112.

In some embodiments, the protection member 150 may be configured to protect the display assembly 120. The structure of the protection member 150 may not be limited, as long as the protection member 150 is connected to the display assembly 120 and has a light transmission property. For example, the protection member 150 may include a glass plate or an acrylic plate.

In some embodiments, an implementation for fixedly connecting the protection member 150 and the display assembly 120 may not be limited. For example, the protection member 150 may be fixed to the display assembly 120 by glue.

In some embodiments, the support member 140 may be configured to support the protection member 150. The structure of the support member 140 may not be limited, so long as the first portion of the support member 140 is fixedly connected to the protection member 150. For example, the support member 140 may include a plastic structure, a metal structure, or a part of plastic structure and a part of metal structure. For example, the first portion of the support member 140 may include the metal plate structure. Other portions of the support member 140 may include the plastic structure or metal structure.

In some embodiments, the first portion of the support member 140 and the connection area of the protection member 150 may form the first bezel area. The display assembly 120 may not be displayed through the first bezel area, that is, when the display assembly 120 displays, the display assembly 120 may not display content at the first bezel area, and the first bezel area may not be lighted up.

In some embodiments, the implementation for connecting the first portion of the support member 140 and the protection member 150 may not be limited. For example, the protection member 150 may have a snap slot. The first portion of the support member 140 may be inserted into the snap slot. In another example, the first portion of the support member 140 may push against or abut the protection member 150 to be fixedly connected. In other embodiments, the first portion of the support member 140 may abut the protection member 150 and be connected by glue.

In some embodiments, the support member 140 may be in the first space 111 as a whole or may be partially in the first space 111.

Figure 2:
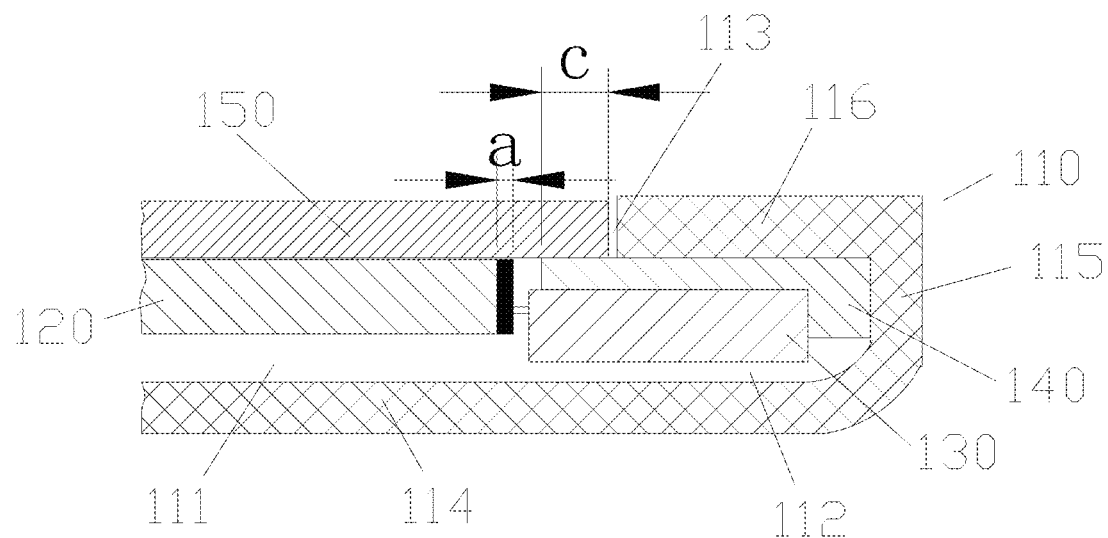
FIG. 2 illustrates a schematic partial structural diagram of another electronic device according to some embodiments of the present disclosure.

For example, as shown in FIG. 1 and FIG. 2, the first portion of the support member 140 is in the first space 111. A second portion of the support member 140 is in the second space 112. The second portion of the support member 140 is fixedly connected to the sidewall 115, which forms the accommodation chamber.

In embodiments of the present disclosure, an implementation for realizing the fixed connection between the second portion of the support member 140 and the sidewall 115, which forms the accommodation chamber, are not limited to those explicitly disclosed herein. For example, the second portion of the support member 140 may be fixedly connected to the sidewall 115, which forms the accommodation chamber, by glue. In another example, the second portion of the support member 140 may be fixedly connected to the sidewall 115, which forms the accommodation chamber, by a bolt.

In embodiments of the present disclosure, a relative position between the support member 140 and the drive component 130 are not limited. For example, as shown in FIG. 1 and FIG. 2, the drive component 130 is between the support member 140 and the bottom wall 114, which forms the accommodation chamber. In another example, as shown in FIG. 1 and FIG. 2, a third space is formed between the drive component 130 and the top wall 116, which forms the accommodation chamber. The first portion of the support member 140 passes through the third space to be fixedly connected to the protection member 150. The drive component 130 does not impact the display area and does not form the bezel area, which greatly reduces the area of the display bezel of the electronic device. As such, the bezel of the electronic device is narrower.

Figure 3:
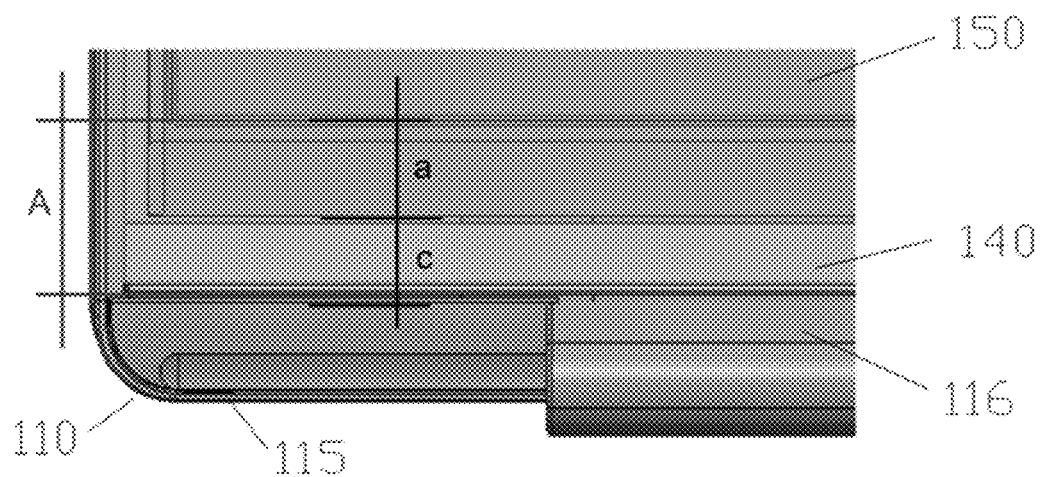
FIG. 3 illustrates a schematic partial structural diagram of the electronic device according to some embodiments of the present disclosure.

In some embodiments, as shown in FIGS. 1-3, the edge portion of the display assembly 120 forms a second bezel area. The first bezel area and the second bezel area form the display bezel of the electronic device.

In some embodiments, the edge portion of the display assembly 120 may be the bezel of the display assembly 120. The edge portion of the display assembly 120 may form the second bezel area. The display assembly 120 may not be able to display through the second bezel area, that is, when the display assembly 120 displays, the display assembly 120 may not be able to display content in the second bezel area, and the second bezel area may not be lighted up.

In some embodiments, the first bezel area may be next to the second bezel area, that is, no other structural members may be between the first bezel area and the second bezel area. The first bezel area and the second bezel area may be connected or form a gap.

In other embodiments, the first bezel area and the second bezel area may form a third bezel area, which may not be displayed, through a partial structure of the drive component 130.

Figure 4:
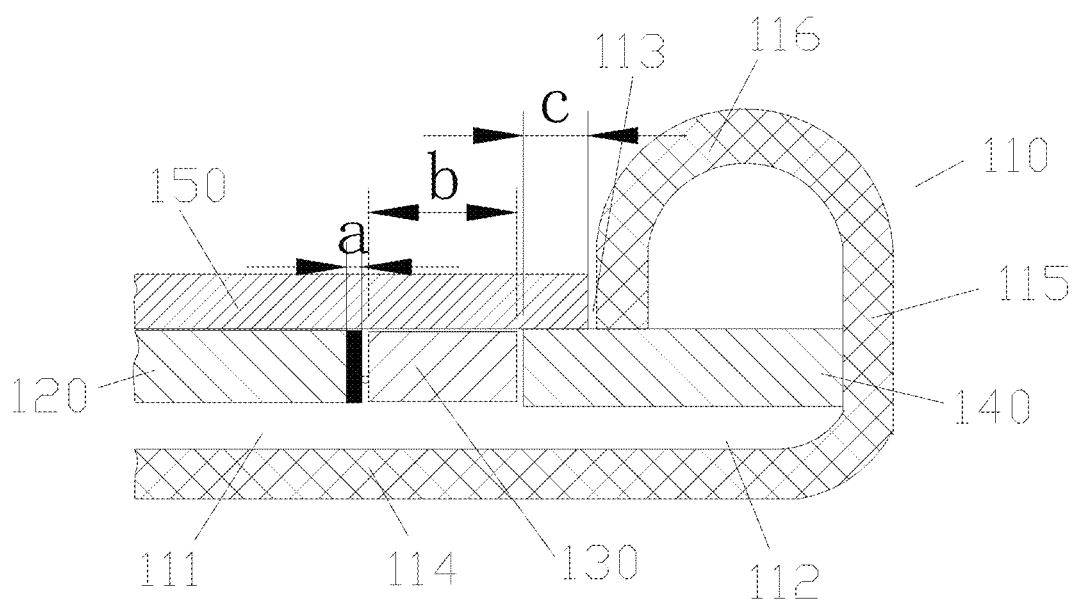
FIG. 4 illustrates a schematic partial structural diagram of the electronic device according to some embodiments of the present disclosure.
Figure 5:
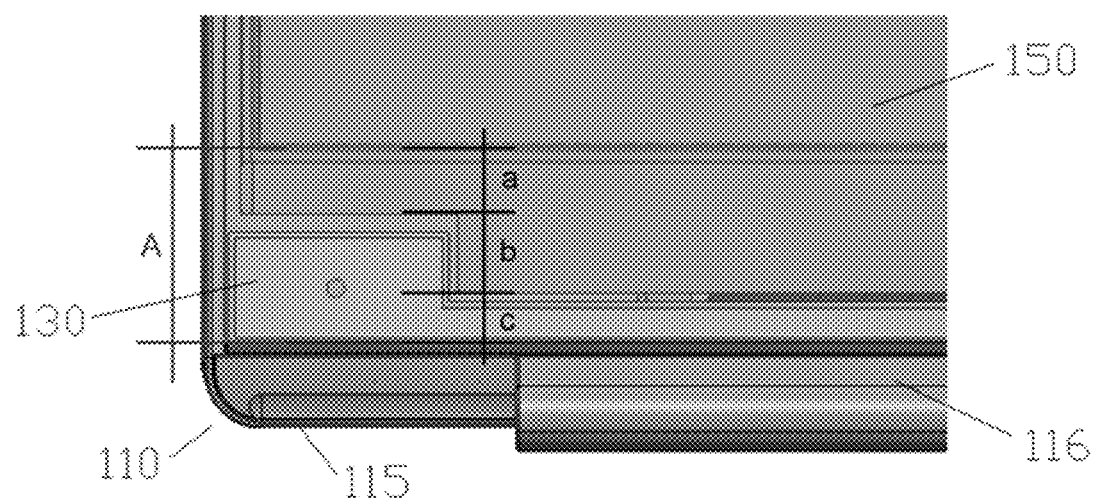
FIG. 5 illustrates a schematic partial structural diagram of the electronic device according to some embodiments of the present disclosure.

In some embodiments, as shown in FIG. 4 and FIG. 5, when the drive component 130 is placed in the first space 111 to form the display bezel, the width of the display bezel of the electronic device is A=a+b+c. a denotes the width of the second bezel area, c denotes the width of the first bezel area, and b denotes the width of the bezel area formed by the drivee component 130. As shown in FIGS. 1-3, when the drive component 130 may not form the bezel area, the width of the display bezel of the electronic device is A=a+c. a denotes the width of the second bezel area, and c denotes the width of the first bezel area. As such, the area of the display bezel of the electronic device may be greatly reduced. Thus, the bezel of the electronic device is narrower.

The above-described formula for calculating the width A of the display bezel ignores small gaps that may exist between adjacent bezels. As shown in FIG. 3 and FIG. 5, to facilitate description, the support member 140 at the bezel area may be seen through the protection member. In practical applications, the inner surface of the protection member 150 corresponding to the bezel area may be painted, such that the protection member 150 may only display the display area of the display assembly.

In some embodiments, the display assembly 120 and the drive component 130 may be staggered along the first direction. The third portion of the display assembly 120 and the fourth portion of the drive component 130 may be staggered along a second direction. The fifth portion of the display assembly 120 and the sixth portion of the drive component 130 may overlap with each other along the second direction. As such, a configuration space of the drive component 130 and the display assembly 120 may be reduced, and the thickness of the electronic device may be reduced along the first direction.

In some embodiments, the first direction is described above and is not repeated here.

In some embodiments, a relative relationship between the first direction and the second direction may not be limited. For example, a first angle may be formed between the first direction and the second direction. The first angle may range from 45° to 90°. For example, the second direction may be perpendicular to the first direction.

In some embodiments, the display assembly 120 and the drive component 130 may be staggered along the first direction, that is, the display assembly 120 and the drive component 130 may not overlap with each along the first direction.

In some embodiments, the third portion of the display assembly 120 and the fourth portion of the drive component 130 may be staggered along the second direction. The fifth portion of the display assembly 120 and the sixth portion of the drive component 130 may overlap with each other along the second direction. The display assembly 120 and the drive component 130 may have overlapped portions and staggered portions along the second direction, that is, have non-overlapped portions.

In other embodiments, the display assembly 120 and the drive component 130 may only have the overlapped portions and may not have the staggered portions.

In the electronic device of embodiments of the present disclosure, by placing at least a part of the drive component 130 in the second space 112 of the accommodation chamber, the volume that the drive component 130 takes from the first space 111 may be reduced, that is, the volume that the drive component 130 takes from the display space may be reduced. As such, the area of the bezel of the electronic device may be reduced, and the bezel of the electronic device may be narrower.

The above-described embodiments are merely specific embodiments of the present disclosure. However, the scope of the present disclosure is not limited to these embodiments. Any skilled in the art familiar with the technical field may easily think of modifications or replacements in the scope of the technology of the present disclosure, and the modifications and replacements are all within the scope of the present disclosure. Therefore, the scope of the present invention should be subjected to the scope of the claims.

What is claimed is:

1. An electronic device, comprising:
a housing including an accommodation chamber and an opening, the opening being connected with the accommodation chamber, the accommodation chamber including a first space and a second space, the first space overlapping with the opening along a first direction, and the second space and the opening being staggered along the first direction;
a display assembly located in the first space of the accommodation chamber and exposed through the opening;
a drive component partially located in the second space of the accommodation chamber, the drive component being electrically connected to the display assembly, and configured to drive the display assembly;
a support member fixed in the accommodation chamber; and
a protection member at the opening of the housing, the protection member being connected to the display assembly and connected to a first portion of the support member, and being able to transit light;
wherein the first portion of the support member and a connection area of the protection member form a first bezel area the display assembly and the drive component are staggered along the first direction; and
a third portion of the display assembly and a fourth portion of the drive component are staggered along a second direction which is perpendicular to the first direction.

2. The electronic device of claim 1, wherein:
the first portion of the support member is in the first space;
a second portion of the support member is in the second space; and
the second portion of the support member is fixedly connected to a sidewall of the accommodation chamber.

3. The electronic device of claim 1, wherein the drive component is between the support member and a bottom wall of the accommodation chamber.

4. The electronic device of claim 1, wherein:
a third space is formed between the drive component and a top wall of the accommodation chamber; and
the first portion of the support member passes through the third space to be fixedly connected to the protection member.

5. The electronic device of claim 1, wherein:
an edge portion of the display assembly forms a second bezel area;
the first bezel area and the second bezel area form a combined bezel area of the electronic device; and
the first bezel area is next to the second bezel area.

6. The electronic device of claim 1, wherein the first portion of the support member abuts the protection member and is fixedly connected to the protection member.

7. The electronic device of claim 1, wherein the first portion of the support member includes a metal plate structure.

8. The electronic device of claim 1, wherein:
a fifth portion of the display assembly and a sixth portion of the drive component overlap with each other along the second direction.

9. The electronic device of claim 1, wherein:
the first space is in a middle of the housing; and
the second space is at an edge portion of the housing.

10. The electronic device of claim 1, wherein:
the display assembly includes a display screen; and
the drive component includes a printed circuit board (PCB).

* * * * *